United States Patent [19]

Hasegawa

[11] Patent Number: 5,421,888
[45] Date of Patent: Jun. 6, 1995

[54] LOW PRESSURE CVD APPARATUS COMPRISING GAS DISTRIBUTION COLLIMATOR

[75] Inventor: Toshiaki Hasegawa, Kanagawa, Japan

[73] Assignee: Sony Corporation, Tokyo, Japan

[21] Appl. No.: 175,690

[22] Filed: Dec. 30, 1993

Related U.S. Application Data

[63] Continuation of Ser. No. 881,643, May 12, 1992, abandoned.

[51] Int. Cl.$^6$ .............................. C23C 16/00
[52] U.S. Cl. ...................... 118/715; 118/724
[58] Field of Search .......... 118/715, 724, 728, 723 E; 156/345

[56] References Cited

U.S. PATENT DOCUMENTS

| | | | |
|---|---|---|---|
| 4,798,165 | 1/1989 | deBoer et al. | 118/715 |
| 4,886,571 | 12/1989 | Suzuki et al. | 156/345 X |
| 4,925,809 | 5/1989 | Mieno | 118/715 |
| 4,999,320 | 3/1991 | Douglas | 156/345 X |
| 5,106,453 | 4/1992 | Benko et al. | 437/81 X |
| 5,108,543 | 4/1992 | Suzuki et al. | 156/643 |
| 5,108,778 | 4/1992 | Suzuki et al. | 156/643 X |
| 5,264,038 | 11/1993 | Hara et al. | 118/715 X |
| 5,350,480 | 9/1994 | Gray | 156/345 X |

FOREIGN PATENT DOCUMENTS

| | | | |
|---|---|---|---|
| 62-131520 | 6/1987 | Japan. | |
| 0418554 | 3/1991 | Japan | 118/715 |

OTHER PUBLICATIONS

Berry et al, Thin Film Technology, 1979, pp. 22–25.

Primary Examiner—Robert Kunemund
Assistant Examiner—Jonathan D. Baskin
Attorney, Agent, or Firm—Hill, Steadman & Simpson

[57] ABSTRACT

The present invention provides a low-pressure CVD apparatus capable of forming a film with improved step coverage and which fills up contact holes without forming any seam therein. The low-pressure CVD apparatus comprises a CVD reaction chamber (6) provided with a source gas inlet (5), a susceptor (1) for supporting a wafer (2), and a gas distributing means (3) disposed between the source gas inlet (5) and a wafer (2) supported on the susceptor (1) to distribute a source gas uniformly over the surface of the wafer (2). The gas distributing means (3) is provided with a plurality of minute pores (16) serving as passages (10a) for the source gas and extending substantially perpendicularly to the surface of the wafer (2).

7 Claims, 6 Drawing Sheets

LOW PRESSURE CVD APPARATUS COMPRISING GAS DISTRIBUTION COLLIMATOR

This is a continuation of application Ser. No. 07/881,643, filed May 12, 1992, now abandoned.

BACKGROUND OF THE INVENTION

1. Field of the Invention

The present invention relates to a low-pressure CVD apparatus (hereinafter referred to as "LP-CVD apparatus") and, more particularly, to a LP-CVD apparatus capable of forming a tungsten blanket layer in improve step coverage.

2. Description of the Prior Art

A nonselective tungsten blanket CVD process (hereinafter referred to as "W-CVD process"), which is capable of filling up minute contact holes and through holes of 0.4 μm square or below in a contact resistance smaller than that of polyplugs formed by filling up minute holes with polycrystalline silicon, has become an attractive technique in the field of the future-generation VLSI industry.

As shown schematically in FIG. 7, a conventional LP-CVD apparatus for forming a tungsten blanket layer has a CVD reaction chamber 6 provided with a source gas inlet 5 through which a source gas 4 is supplied into the CVD reaction chamber 6, a susceptor 1, i.e., a support table, for supporting a wafer or workpiece 2, disposed within the CVD reaction chamber 6, and a shower head 3, i.e., a source gas distributing means, for distributing the source gas 4 over the surface of the wafer 2.

The shower head 3 of this known LP-CVD apparatus of a single-wafer processing system is a ceramic plate having a thickness on the order of about 1 to 2 mm provided with holes of about 2.0 mm in diameter in a random arrangement. The shower head 3 is disposed so as to distribute the source gas 4 uniformly over the wafer 2.

Since the LP-CVD apparatus shown in FIG. 7 does not control the direction of travel of molecules of the source gas 4, molecules of the source gas fall in a substantially isotropic mode into a contact hole (or a trench) 13 as shown in FIG. 8. During this W-CVD process, a seam 14 having a void is formed in the contact hole 13 as shown in FIG. 8, because the tungsten blanket layer 12 grows at substantially the same deposition rate in a vertical direction and in a horizontal direction over a barrier metal layer 11 so that A and B are approximately equal to each other and the aspect ratio of the contact hole 13 increases with the progress of deposition. Thus, it has been impossible to fill up the contact hole 13 perfectly without forming any void therein by the W-CVD process. Accordingly, in etching back the surface of the tungsten blanket layer to form a tungsten plug, the upper portion of the seam is enlarged as shown in FIG. 9 and the enlarged seam forms a void 14a under a wiring layer, not shown, formed over an interlayer insulating film 9, adversely affecting the reliability of the wiring layer.

SUMMARY OF THE INVENTION

Accordingly, it is an object of the present invention to provide a LP-CVD apparatus capable of forming a film in an improved step coverage and of filling up contact holes and the like without forming any seams and voids.

In one aspect of the present invention, a LP-CVD apparatus comprises: a CVD reaction chamber provided with a source gas inlet; a susceptor for supporting a wafer or workpiece; and a gas distributing means interposed between the source gas inlet and the susceptor; wherein the gas distributing means is provided with a plurality of minute pores serving as passages for a source gas and extending substantially perpendicularly to the surface of a wafer supported on the susceptor.

Preferably, the length of the plurality of minute pores of the gas distributing means is not smaller than the mean free path of the source gas, because minute pores of such a length are able to bias the gas velocity distribution curve so that the probability of a velocity perpendicular to the surface of the wafer is increased. Since the plurality of minute pores extending substantially perpendicularly to the surface of the wafer supported on the susceptor increase the probability of a velocity of molecules of the source gas perpendicular to the surface of the wafer, step coverage is improved in filling up contact holes and the like by deposition and contact holes can be filled up with, for example, tungsten without forming any seam in the contact holes.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
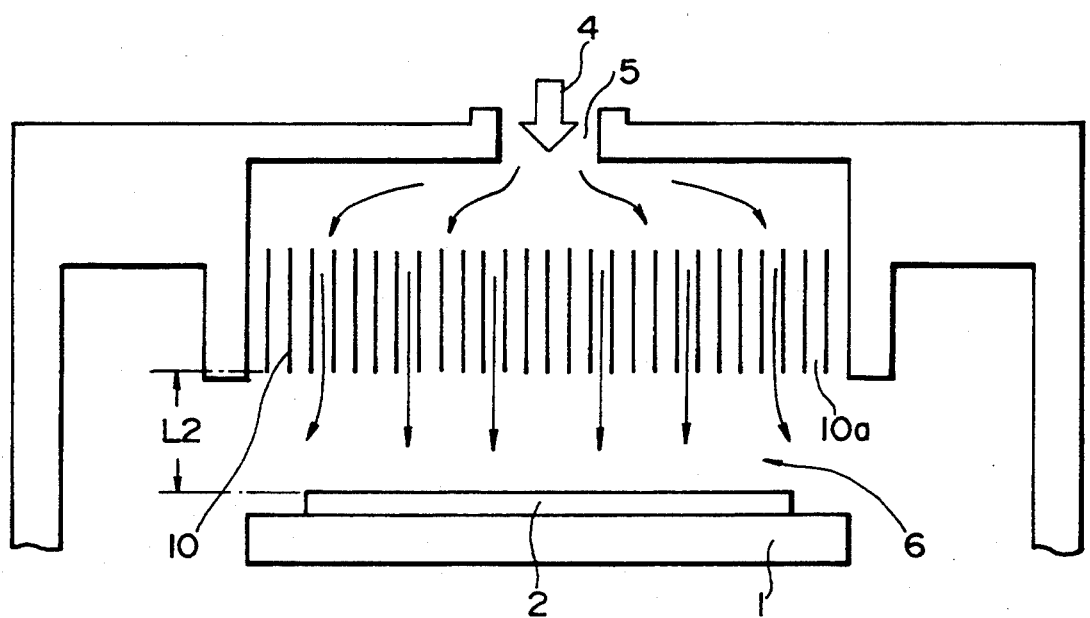
FIG. 1 is a schematic view of a LP-CVD apparatus in a preferred embodiment according to the present invention.
Figure 2A:
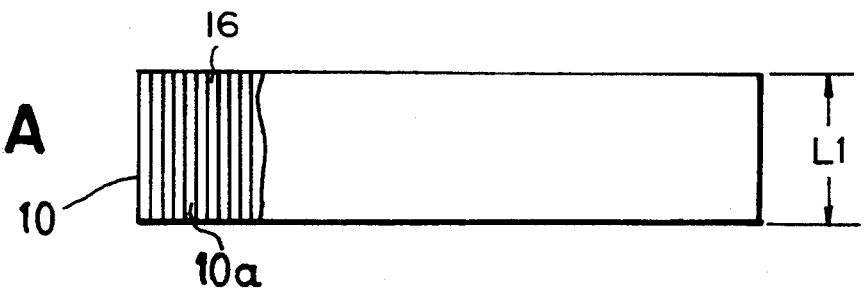
FIGS. 2(a) and 2(b) are schematic views of a shower head with a collimator employed in the LP-CVD apparatus of FIG. 1.
Figure 2B:
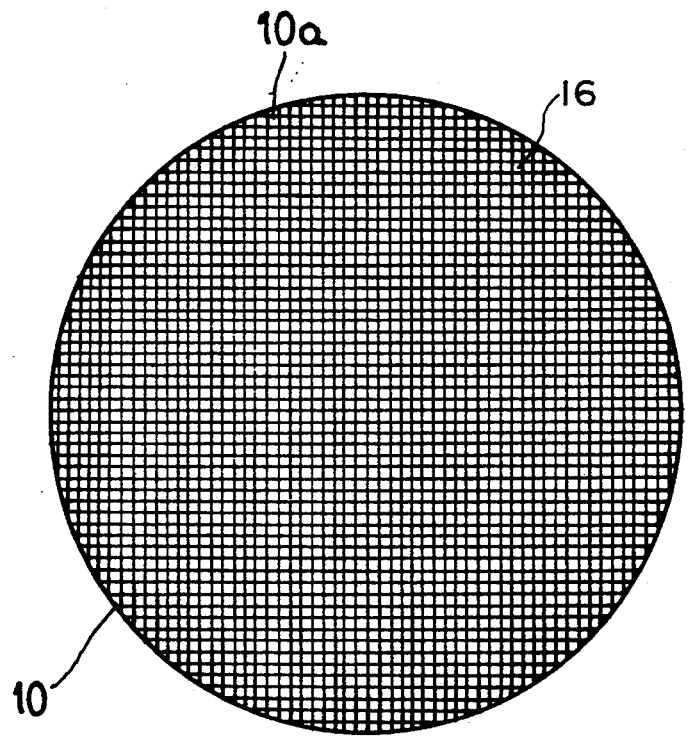

Referring to FIG. 1, a LP-CVD apparatus embodying the present invention is provided with a shower head 10 with a collimator. As shown in FIGS. 2(a) and 2(b), the shower head 10 with a collimator is a disk formed of, for example, aluminum and provided with a plurality of minute pores 16 serving as passages 10a for a source gas and having a thickness L1 of about 2 cm, which is greater than the mean free path λ (cm) of molecules of a source gas determined by an expression (1).

$$\lambda = 1/\sqrt{2}\pi a^2 n \qquad (1)$$

where $a$ is the size of molecules and n is the number of molecules of an ideal gas per cubic meter.

The mean free path $\lambda$ is about 1.1 cm when the source gas is $WF_6$ for depositing tungsten by CVD, the size of molecules of $WF_6$ is about 4 Å, the temperature is 470° C. and the pressure is 1 mtorr. A stable laminar flow of the source gas is produced when the thickness L1 of the shower head 10 is greater than the mean free pass $\lambda$ and greater than the distance L2 between the lower surface of the shower head 10 with a collimator and the upper surface of a wafer or workpiece 2 supported on a susceptor 1.

Figure 3:
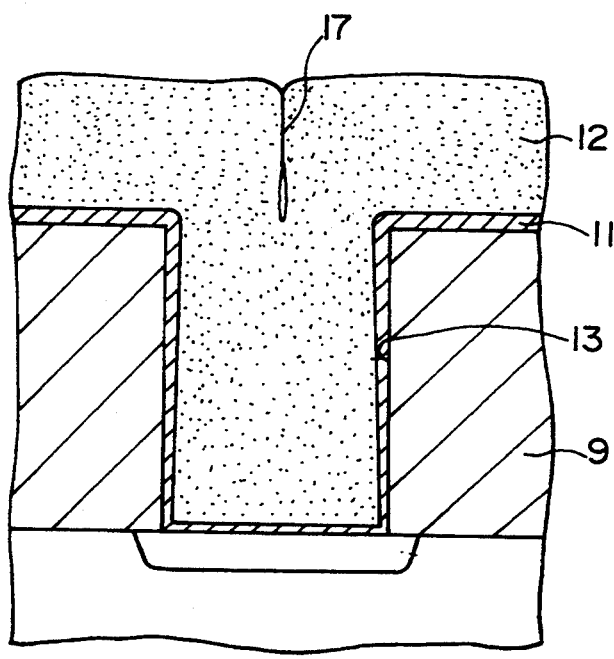
FIG. 3 is a sectional view of a work provided with a tungsten blanket layer formed by the LP-CVD apparatus of FIG. 1.
Figure 4:
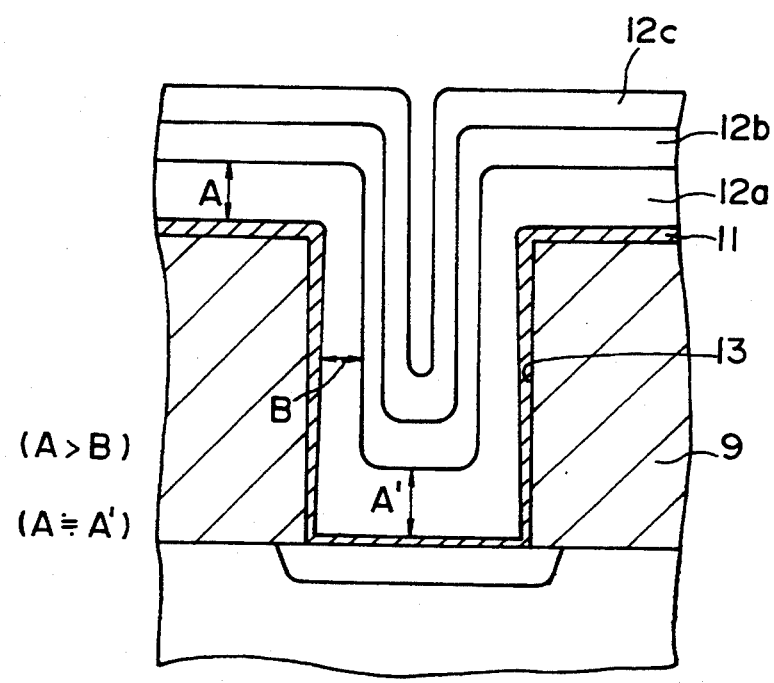
FIG. 4 is a sectional view of assistance in explaining a process of forming a tungsten layer by the LP-CVD apparatus of FIG. 1.
Figure 5:
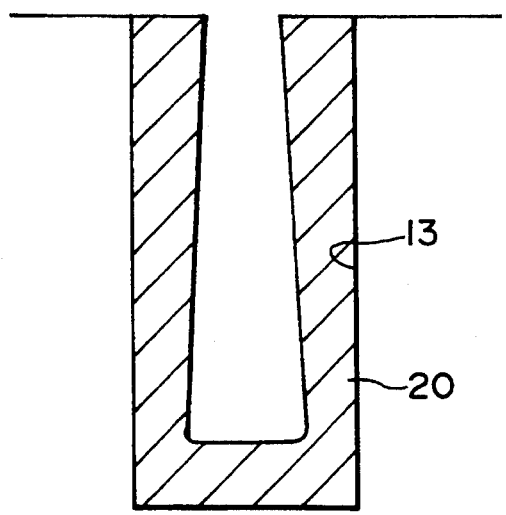
FIG. 5 is a diagrammatic view showing the result of simulation using a deposition/etching model on an assumption that molecules are deposited in an anisotropic mode (present invention)
Figure 6:
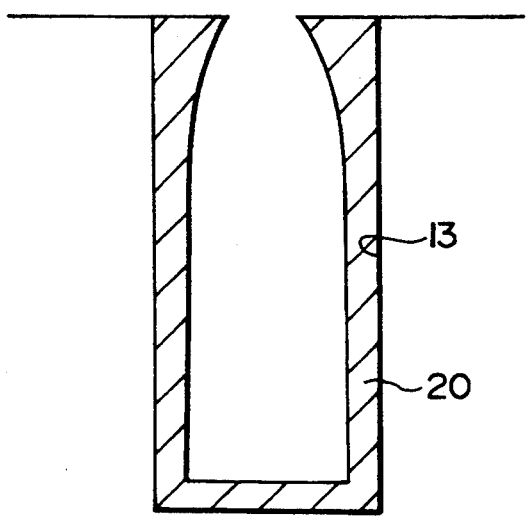
FIG. 6 is a diagrammatic view showing the result of simulation using a deposition/etching model on an assumption that molecules are deposited in an isotropic mode.
Figure 7:
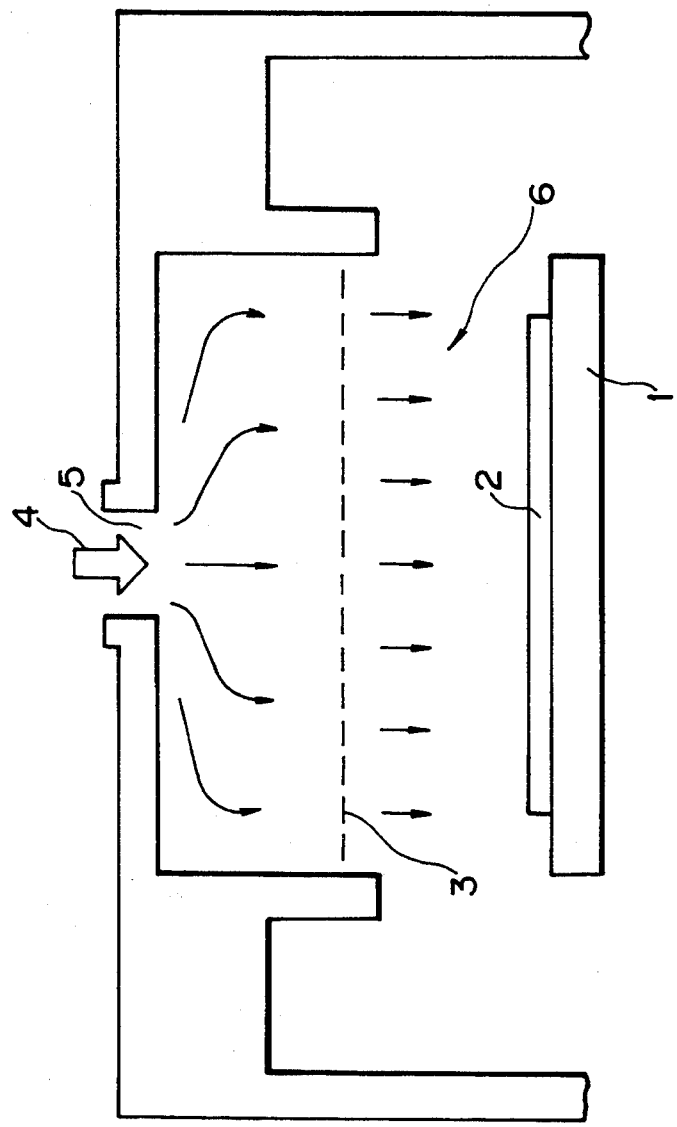
FIG. 7 is a schematic view of a conventional LP-CVD apparatus.
Figure 8:
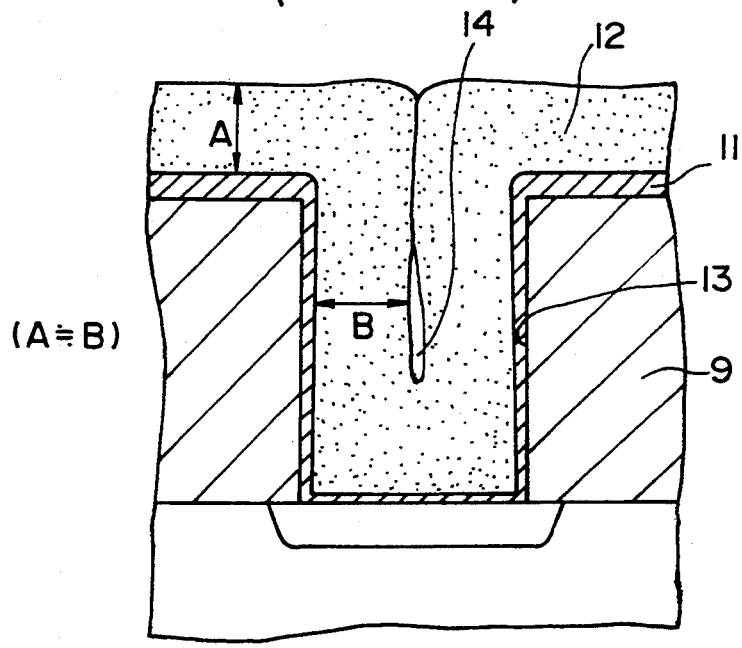
FIG. 8 is a sectional view of a work provided with a tungsten blanket layer formed by the LP-CVD apparatus of FIG. 7.
Figure 9:
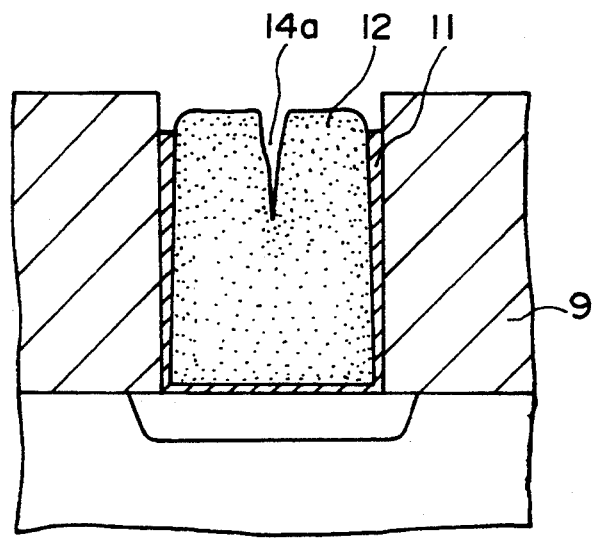
FIG. 9 is a sectional view of the work after etching back the tungsten blanket layer of FIG. 8.

Tungsten was deposited over the entire surface of a work having contact holes in a tungsten layer 12 by the LP-CVD apparatus. As shown in FIG. 3 the tungsten layer 12 has a short seam 17 separated from the surface of the work and no seam is formed in portions of the tungsten layer 12 filling up a contact hole 13. The shower head 10 with a collimator increases the probability of a velocity of molecules perpendicular to the surface of the wafer 2 in the gas velocity distribution curve, so that the deposition rate on horizontal surfaces is higher than that on vertical surfaces. Consequently, tungsten layers 12a, 12b and 12c meet an inequality A > B and the thickness A' of the tungsten layers 12a, 12b and 12c on the bottom surface of the contact hole 13 is approximately equal to the thickness A of the same on the surface of the work (FIG. 4). In FIGS. 3 and 4, parts like or corresponding to those shown in FIG. 8 are denoted by the same reference characters. FIGS. 5 and 6 show the results of simulation of deposition/etching conducted on an assumption that molecules fall on the work in an anisotropic mode and in an isotropic mode, respectively, in forming a film by a LP-CVD process. The simulation was conducted on an assumption that the sticking coefficient is 0.1. The simulation used a mechanism disclosed in J. P. McVittie (Stanford Univ.) et al., "A Profiles Simulator for Etching and Deposition, SPEEDIE" made public in the Dry Process Symposium, 1990.

As is obvious from films 20 shown in FIG. 5 and 6 formed by LP-CVD processes, the LP-CVD apparatus of the present invention forms the films 20 in a satisfactory step coverage, and the difference between the thickness of a portion of the film 20 near the upper end of the contact hole 13 and that of a portion of the film 20 on the bottom surface of the contact hole 13 is small.

The LP-CVD apparatus of the present invention is effective also when a source gas other than the $WF_6$, such as a mixed gas of $O_3$ and TEOS gas for forming a $SiO_2$ film.

Although the invention has been described in its preferred form with a certain degree of particularity, obviously many changes and variations are possible therein. It is therefore to be understood that the present invention may be practiced otherwise than as specifically described herein without departing the spirit and scope thereof.

What is claimed is:

1. A low-pressure CVD apparatus comprising: a CVD reaction chamber provided with a source gas inlet; a susceptor for supporting a wafer with an upper surface facing the inlet; and a gas distributing means disposed between the source gas inlet and the wafer supported on the susceptor to distribute a source gas as a stable laminar gas flow across the entire upper surface of the wafer and to increase the deposition rate on a surface extending perpendicular to a direction of the laminar gas flow relative to the deposition rate on a surface extending parallel to the gas flow; said gas distributing means being a collimator provided with a plurality of through holes serving as passages for creating the stable laminar gas flow from the source gas and extending substantially perpendicularly to the surface of the wafer, each of the through holes having a length L 1 being greater than the mean free path of molecules of the source gas and the length L1 being greater than a distance L2 between a lower surface of the collimator and the upper surface of the wafer.

2. A low-pressure CVD apparatus according to claim 1, Wherein length L1 is about 2 cm.

3. A low-pressure CVD apparatus according to claim 2, wherein the collimator is an aluminum disc.

4. A low-pressure CVD apparatus according to claim 1, wherein the collimator is made of aluminum.

5. A low-pressure CVD apparatus consisting of a CVD reaction chamber provided with a source gas inlet; a susceptor for supporting a wafer with an upper surface facing the inlet; and a gas distributing means disposed between the source gas inlet and the wafer supported on the susceptor to distribute a source gas as a stable laminar gas flow across the entire upper surface of the wafer and to increase the deposition rate on a surface extending perpendicular to a direction of the laminar gas flow relative to the deposition rate on a surface extending parallel to the gas flow; said gas distributing means consisting of a collimator provided with a plurality of through holes serving as passages for creating the stable laminar gas flow from the source gas and extending substantially perpendicularly to the surface of the wafer, each of the through holes having a length L 1 being greater than the mean free path of molecules of the source gas and the length L 1 being greater than a distance L2 between a lower surface of the collimator and the upper surface of the wafer.

6. A low-pressure CVD apparatus according to claim 5, wherein the length L1 is about 2 cm.

7. A low-pressure CVD apparatus according to claim 5, wherein the collimator is made of aluminum.

* * * * *